United States Patent
Takahashi et al.

(10) Patent No.: US 7,203,113 B2
(45) Date of Patent: Apr. 10, 2007

(54) SEMICONDUCTOR STORAGE DEVICE

(75) Inventors: Hiroyuki Takahashi, Kanagawa (JP);
Takato Shimoyama, Kanagawa (JP);
Takuya Hirota, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 79 days.

(21) Appl. No.: 11/090,151

(22) Filed: Mar. 28, 2005

(65) Prior Publication Data
US 2005/0219930 A1    Oct. 6, 2005

(30) Foreign Application Priority Data
Mar. 30, 2004   (JP)   ............................. 2004-100581

(51) Int. Cl.
*G11C 7/00*   (2006.01)

(52) U.S. Cl. .................. 365/222; 365/189.04; 365/229

(58) Field of Classification Search ................. 365/222
See application file for complete search history.

(56) References Cited

U.S. PATENT DOCUMENTS

2003/0198098 A1* 10/2003 Fujioka et al. .............. 365/200

OTHER PUBLICATIONS

NEC Electronics Product Information "Mobile Specified RAM". Micron 4Meg×16 ASYNC/PAGE/BURST CellularRam Memory, pp. 5 and 10.

* cited by examiner

*Primary Examiner*—Thong Q. Le
(74) *Attorney, Agent, or Firm*—Sughrue Mion, PLLC (57) ABSTRACT

Disclosed is a semiconductor storage device in which control is performed in such a manner that if the refresh operation is not being performed when a chip-select signal undergoes a transition from an inactive (standby) state to an active state, read or write access is executed immediately and if the refresh operation is in progress when the chip-select signal undergoes a transition from the inactive state to the active state, a wait signal for causing read or write access to wait is generated by a wait generating circuit.

14 Claims, 8 Drawing Sheets

SEMICONDUCTOR STORAGE DEVICE

FIELD OF THE INVENTION

This invention relates to a semiconductor storage device. More particularly, the invention relates to a semiconductor storage device that avoids a decline in access speed due to refresh of a semiconductor storage device having a memory cell that requires refresh in retention of data.

BACKGROUND OF THE INVENTION

A semiconductor storage device in which a cell array is constituted by a plurality of dynamic memory cells each requiring refresh in order for data to be retained and which functions as a static random-access memory (SRAM (such a storage device is also referred to as "pseudo SRAM") has been used. A Mobile Specified RAM Family [also referred to as an "MSRAM" (registered trademark)] also has been developed [see NEC Memory Product Information "Mobile Specified RAM" (search conducted on Dec. 7, 2003), Internet URL:

<http://www.necel.com/memory/japanese/products/msram/info.html>]. An MSRAM (registered trademark) is functionally compatible with a low-power-consumption SRAM and achieves a large increase in capacity (e.g., 16 to 128 M), which is not possible with an SRAM, by employing a DRAM memory cell.

Figure 6A:
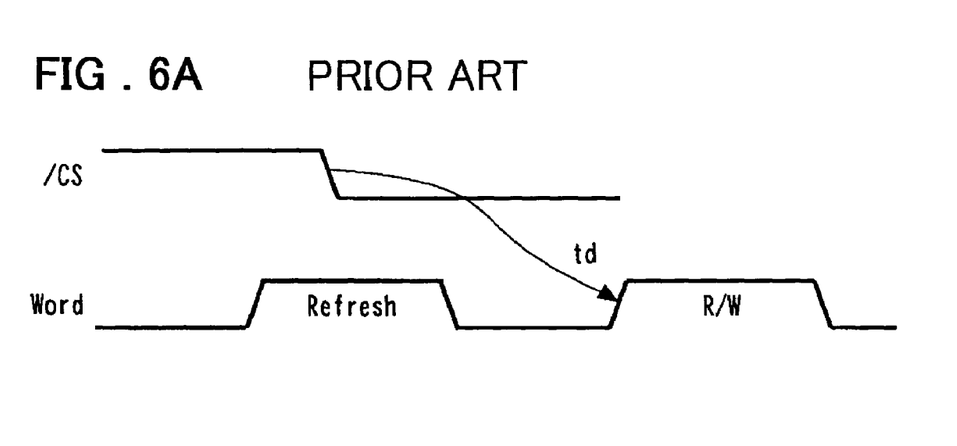
FIGS. 6A and 6B are diagrams useful in describing operation of a conventional semiconductor storage device at the time of a transition to the active state.

In a semiconductor storage device such as an MSRAM (registered trademark), partial refresh, etc., is performed when the device is in the standby mode. If refresh is being executed at the time of a transition from the standby mode (when a chip-select signal /CS is at the high level) to the active mode, there is a possibility that the refresh operation will conflict with read/write access of the semiconductor storage device from the outside. For this reason, it is so arranged that the read/write activating operation in the cell array is performed after refresh ends following a delay of a prescribed delay time td (which is equivalent to the time for refresh to end) from the timing of the transition from the inactive to the active state of the chip-select signal /CS, as illustrated in FIG. 6A. In FIG. 6A, "Word" indicates the interval of activation of a selected word line, "Refresh" represents a word line corresponding to a refresh address, and R/W indicates a high-potential interval (pulse voltage waveform) of the word line corresponding to access address of read/write.

Figure 6B:
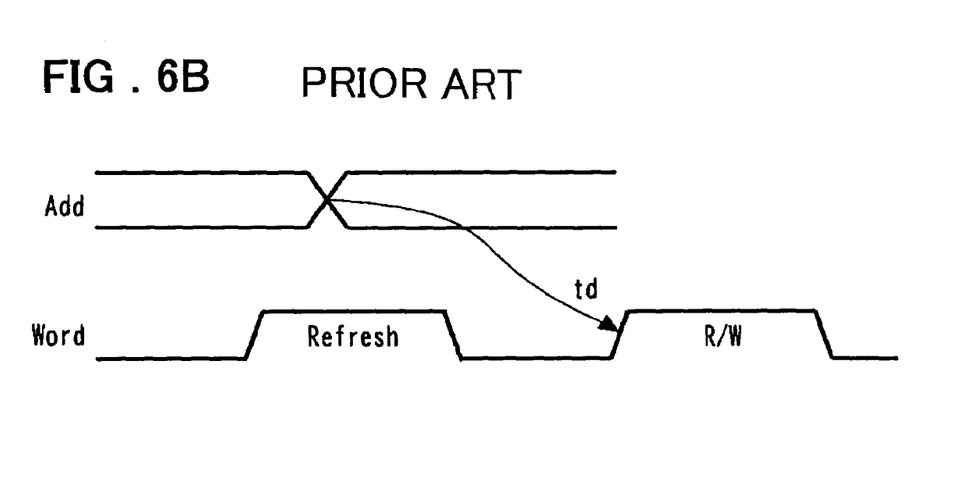

Further, since there is the possibility of a conflict with internal refresh at the time of address selection, it is so arranged that the read/write activating operation is performed following a delay of a prescribed delay time td from the timing of the address-signal transition (finalization of the address signal), as indicated in FIG. 6B.

On the other hand, with a general-purpose DRAM product, it is required that refresh be performed externally periodically based upon the data retention characteristic (cell leak characteristic) even in an active interval in which refresh is not being carried out. That is, it is necessary to interrupt the active interval and perform refresh. In this case, throughput of the memory declines owing to insertion of refresh.

Figure 8:
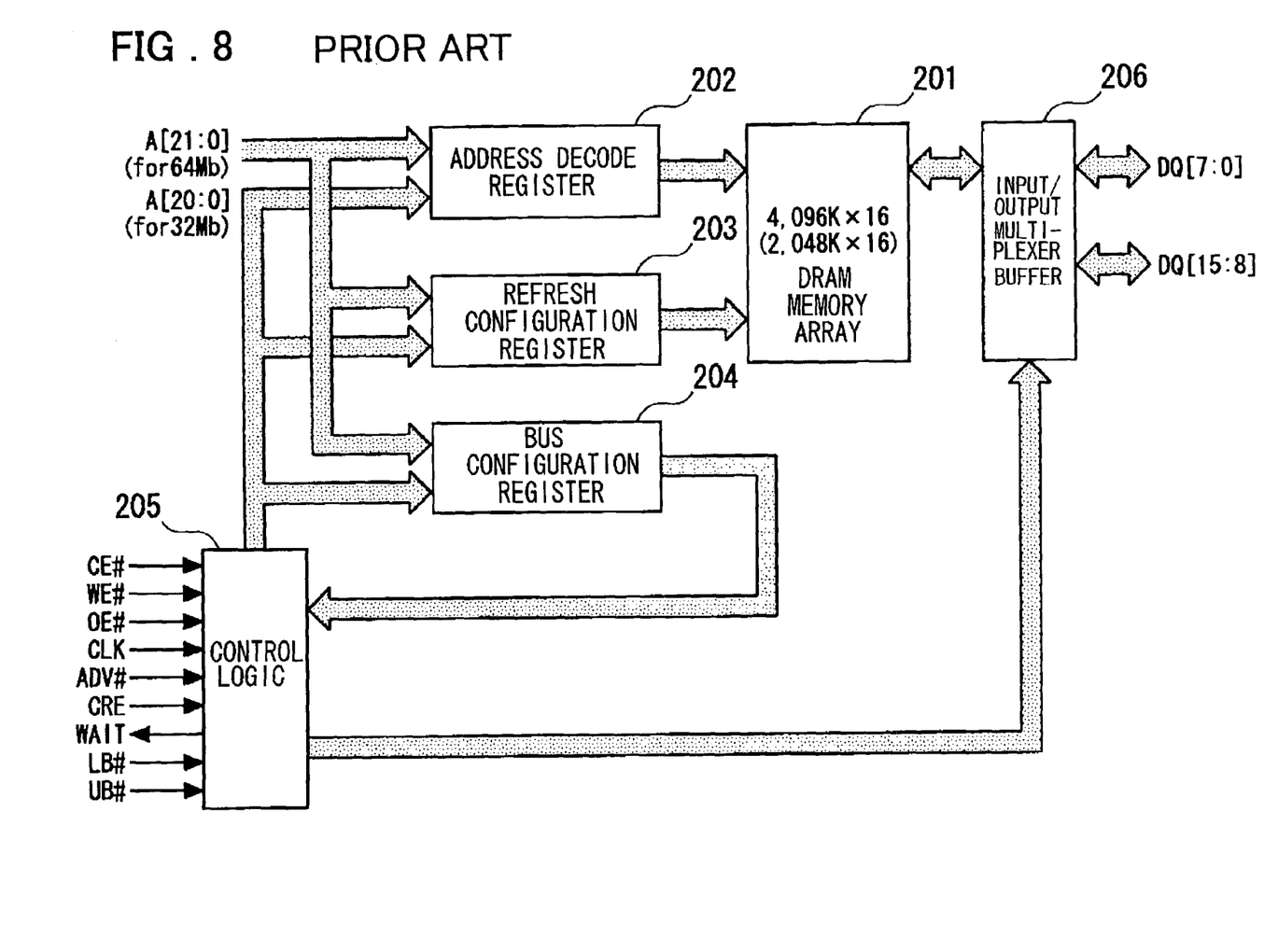
FIG. 8 is a diagram illustrating an example of the structure of a semiconductor storage device according to the prior art.

Furthermore, in a semiconductor storage device of SRAM specifications using a DRAM cell, an arrangement in which a WAIT pin is provided to halt external access at the time of internal-refresh execution is known [MICRON 4 MEG×16, 2 MEG×16 ASYNC/PAGE/Burst CellularRAM MEMORY, pp. 5, 10, (search conducted on Nov. 12, 2003), Internet URL: <http://download.micron.com/pdf/products/psram/burst_cellularram.pdf>]. FIG. 8 illustrates an example of the structure of such a semiconductor storage device. A CellularRAM (TM) shown in FIG. 8 has a self-refresh function. Hidden refresh requires no support of refresh from an external system controller (not shown) and has no influence upon read/write performance. In FIG. 8, a refresh configuration register 203 sets how refresh of a DRAM array 201 is performed. In order to reduce standby current, the device has mechanisms for partial refresh, which refreshes only the part that contains essential data, for temperature-compensated refresh, which controls the refresh rate based upon the device operating temperature, and for deep power-down, which halts the refresh operation. In FIG. 8, CLK represents a synchronizing clock signal, ADV# a control signal indicating that a valid address exists on the address bus, and CRE a configuration-register enable signal. When CRE is high, writing is performed to the refresh configuration register 203 and to a bus configuration register 204. CE# is a chip-enable signal. When this signal is in the high level, the device transitions to standby. OE# represents an output-enable signal, WE# a write-enable signal, LB# a low byte-enable signal and UB# a high byte-enable signal. DQ is a data input/output terminal. WAIT is used to arbitrate conflict between refresh and the read/write operation. This arrangement is such that when a refresh trigger is generated from a refresh timer (not shown), the WAIT signal is activated (sent to the low level) to notify the external system memory controller (not shown) and delay read/write access.

[Non-Patent Document 1]
NEC Memory Product Information "Mobile Specified RAM" (search conducted on Dec. 7, 2003), Internet URL: http://www.necel.com/memory/japanese/products/msram/info.html

[Non-Patent Document 2]
MICRON 4 MEG×16, 2MEG×16 ASYNC/PAGE/Burst CellularRAM MEMORY, pp. 5, 10, (search conducted on Nov. 12, 2003), Internet URL: http://download.micron.com/pdf/products/psram/burst_cellularram.pdfl

SUMMARY OF THE DISCLOSURE

Thus, in order to avoid a conflict between refresh and read/write access at the time of a transition from the standby state to the active state in a conventional semiconductor storage device, read/write access is carried out following a delay of a predetermined time from the timing of the transition from the standby mode to the active state. This invites a decline in the performance such as an access time, operating cycle and the like.

Further, the arrangement in which read/write access is always made to wait until refresh ends also invites a decline in the performance such as an access time, operating cycle and the like, and increases the load upon the external system controller.

A semiconductor storage device according to one aspect of the present invention, comprises a memory cell array having a plurality of memory cells, which require a refresh operation in order for data to be retained, at intersections of a plurality of bit lines and a plurality of word lines; and a circuit for executing read or write access immediately if a refresh operation is not being performed when a control signal that controls a standby state and an active state of the semiconductor storage device undergoes a transition from the standby state to a value indicative of the active state, and for outputting a wait signal, which is for causing read or write access to wait, if the refresh operation is in progress when the control signal undergoes a transition from the standby state to the active state.

In the present invention, the control signal and a refresh signal that controls execution of the refresh operation are input to the semiconductor storage device, and control is exercised in such a manner that the wait signal is set to the active state and output if the refresh signal is indicating the refresh operation in a cycle interval in which the control signal undergoes a transition from the standby state to a value that specifies the active state, and the setting of the wait signal from an inactive state to the active state is disabled in intervals other than the cycle interval. The wait signal is placed in the active state and output for a predetermined prescribed number of cycles.

In the present invention, the semiconductor storage device may be provided with a control circuit for exercising control in such a manner that refresh is performed after the memory cell array is activated for read or write access when a refresh request is generated at the time of read or write access.

In the present invention, a word line that has been selected by an access address is activated at the time of read access, and in an interval in which a plurality of items of data, which have been read out of the memory cell array, are output from a data terminal successively, a word line corresponding to a refresh address is activated and refresh performed.

In the present invention, the semiconductor storage device may be provided with a control circuit for generating a refresh address and performing a refresh operation based upon a refresh trigger signal for starting up refresh, and a circuit for exercising control in such a manner that when the refresh trigger signal is activated concurrent with a read operation, a word line of the refresh address is activated and refresh performed in parallel with an operation for activating a word line of a read access address and reading out, in a burst from a data terminal, a plurality of items of data that have been read out via a sense amplifier.

A semiconductor storage device according to another aspect of the present invention, comprises a control circuit to which is input at least a control signal (referred to as a "chip-select signal") that controls the standby state and active state of the semiconductor storage device; and a wait signal generating circuit for generating and outputting a wait signal based upon an output signal from the control circuit; wherein the control circuit exercises control in such a manner that output of the wait signal, which indicates that a refresh operation is in progress, from the wait signal generating circuit is enabled in a cycle in which the chip-select signal undergoes a transition, and output of the wait signal is disabled in intervals other than the cycle.

The meritorious effects of the present invention are summarized as follows.

In accordance with the present invention, an entered read/write access request is executed immediately if a refresh operation is in progress at the time of a transition from the standby state to the active state. As a result, access is implemented at high speed.

Further, in accordance with the present invention, if read/write access and a refresh request occur concurrently, refresh is postponed until later and performed in parallel with an interval in which data, which has been read out a memory cell by read access, is output. In addition, refresh is hidden externally and special refresh-control handshake with a CPU or controller that controls the semiconductor storage device is made unnecessary. As a result, access is implemented at high speed.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of the present invention will be described below.

The present invention provides a semiconductor storage device in which a cell array is constituted by DRAM cells and the device is set to a standby state and an active state based upon a control signal (/CS). Control is exercised in such a manner that when a refresh request is generated within the semiconductor storage device in concurrence with, e.g., a read operation when the semiconductor storage device is in the active state, a word line of a refresh address is activated and refresh performed in parallel with an operation for activating a word line selected by a read access request and reading out, in a burst from a data terminal (DATA), a plurality of items of data that have been read out of the cell array. In accordance with the present invention, a decline in access speed ascribable to refresh is avoided, refresh is hidden with respect to an external CPU or controller, special refresh-control handshake with the external CPU or controller is made unnecessary and access is implemented at high speed.

Further, in accordance with the present invention, if a refresh operation is not being performed when a control signal (/CS) for controlling the standby state and active state of the semiconductor storage device undergoes a transition from the standby state to a value indicative of the active state, then read or write access is executed immediately to realize higher speed. On the other hand, if a refresh operation is in progress within the semiconductor storage device when the semiconductor storage device undergoes a transition from the standby state to the active state, then control is exercised so as to output a wait signal and read or write access is executed after the refresh operation ends.

In accordance with the present invention, the control signal and a refresh signal that controls execution of the refresh operation are input to the semiconductor storage device, and control is exercised in such a manner that the wait signal is set to the active state and output if the refresh signal is indicative of the refresh operation in a cycle (α1 and α2 in FIGS. 4A and 4B) in which a control signal (/CS) that controls the standby state and active state of the semiconductor storage device undergoes a transition from the standby state to a value that specifies the active state, and the setting of the wait signal from an inactive state to the active state is disabled in intervals other than the cycle interval.

Preferred embodiments of the present invention will now be described in detail.

Figure 1:
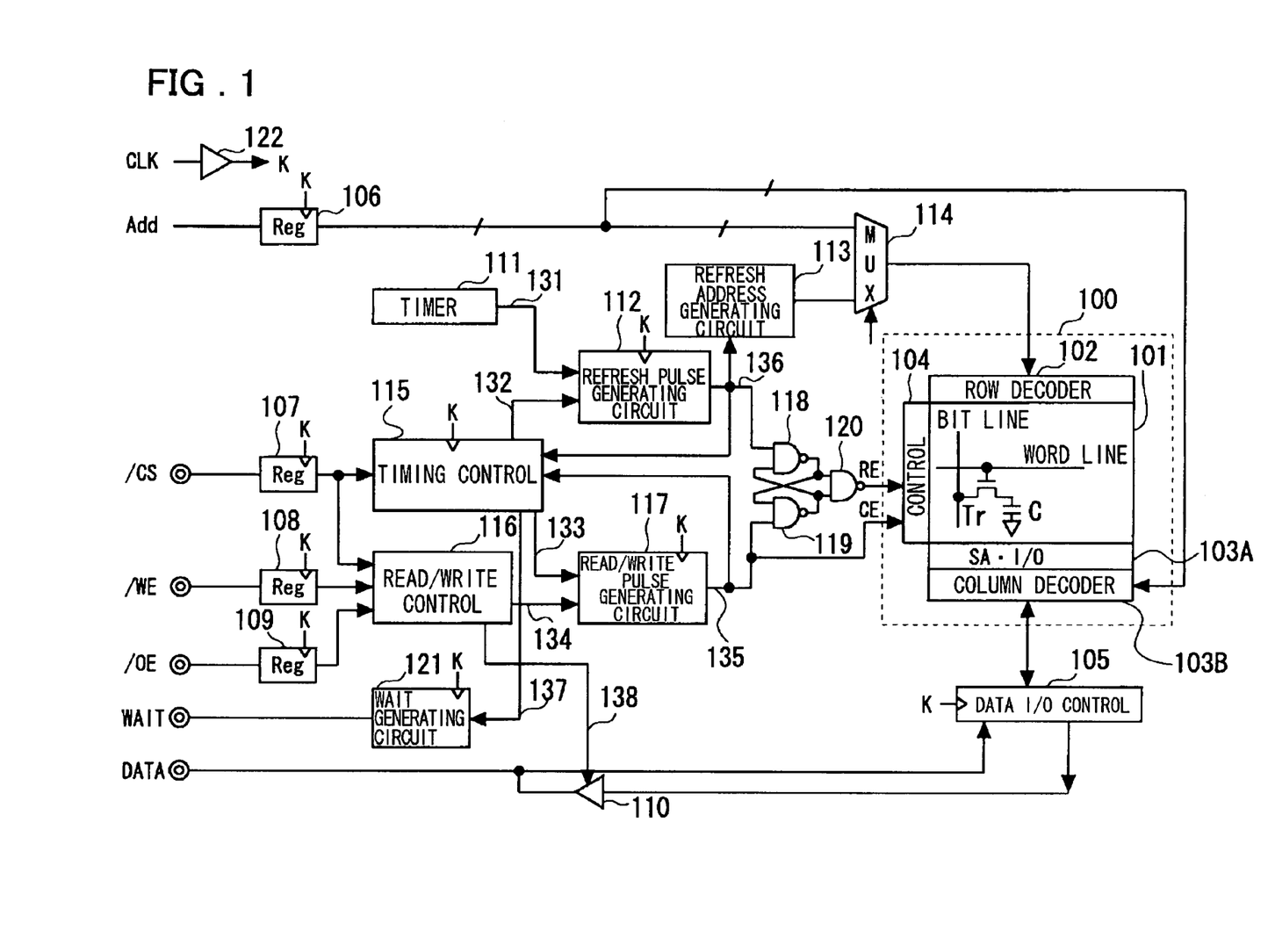
FIG. 1 is a diagram illustrating the structure of a semiconductor storage device according to an embodiment of the present invention.

FIG. 1 is a diagram illustrating the structure of a semiconductor storage device according to a preferred embodiment of the present invention. In FIG. 1, the present invention is applied to a semiconductor storage device in which a cell array is constituted by DRAM cells, the device having interface compatibility with a clock-synchronized SRAM equipped with a self-refresh function and burst function.

As shown in FIG. 1, the semiconductor storage device according to the present embodiment includes a memory array 101 having memory cells at the intersections of a plurality of bit lines and a plurality of word lines; a row decoder 102 for decoding a row address and driving a selected word line; a sense amplifier and I/O controller 103A for differentially amplifying a pre-charged bit-line pair and changing over input/output data; a column decoder 103B for decoding a column address and making a connection between a sense amplifier, which corresponds to a selected bit line, and an input/output line; and a control circuit 104. The memory array 101, row decoder 102, sense amplifier and I/O controller 103A, column decoder 103B and control circuit 104 construct one cell array 100. One memory cell comprises a capacitor C for storing data, and a transistor Tr in which a gate is connected to a word line, one of source and drain diffusion layers is connected to the capacitor C, and the other of the source and drain diffusion layers is connected to a bit line. In FIG. 1, an arrangement having one cell array 100 is illustrated for the sake of simplicity. However, an arrangement having a plurality of cell arrays may be adopted as a matter of course.

Furthermore, the semiconductor storage device of the present invention comprises a data I/O control circuit 105 having a register for holding data that has entered in a burst state from a data terminal DATA, e.g., a register for serial-to-parallel converting data and outputting the data to the sense amplifier and I/O controller 103A of the cell array 100, and for holding data that has been read out of the sense amplifier and I/O controller 103A of the cell array 100, the circuit 105 exercising control for serial-to-parallel converting data and outputting read-out data in the order of the addresses; an address register 106 for latching an address signal that has been input to an address terminal Add; an output buffer 110 for outputting read-out data, which has been output from the data I/O control circuit 105, to the data terminal DATA common for input and output; a refresh timer (referred to simply as a "timer" below) 111 for starting up refresh periodically; a refresh pulse generating circuit 112 for generating a pulse signal (referred to as a "refresh pulse" below) for refresh drive; a refresh address generating circuit 113 for generating a refresh address; a multiplexer (selecting circuit) 114, to which a row address of an address signal that enters from the address terminal Add and a refresh address that is output from the refresh address generating circuit 113 are input, for outputting the refresh address to the row decoder 102 at the time of refresh; a timing control circuit 115; a read/write control circuit 116; a read/write pulse generating circuit 117 for generating a pulse signal (referred to as a "read/write address") for controlling the read/write operation in the cell array 100; a wait generating circuit 121 for generating and outputting a wait signal; and a clock generating circuit 122 for generating an internal clock K (or K and it complement /K) based upon an externally applied clock signal CLK.

Furthermore, the semiconductor storage device has registers 107, 108, and 109, to which a chip-select signal /CS, write-enable signal /WE and output-enable signal /OE, respectively, are input from control terminals, for latching respective ones of these signals in accordance with the internal clock signal K. The timing control circuit 115 generates timing control signals 132, 133 and 137 based upon the chip-select signal /CS that has been output from the register 107, and outputs these signals to the refresh pulse generating circuit 112, read/write pulse generating circuit 117 and wait generating circuit 121, respectively. The chip-select signal /CS, write-enable signal /WE and output-enable signal /OE enter the read/write control circuit 116, which outputs a read/write control signal 134 and an output-enable signal 138 to the read/write pulse generating circuit 117 and output buffer 110, respectively. The read/write pulse generating circuit 117 receives the read/write control signal 134 and outputs a read/write pulse φR/W (135). In response to time-out in the refresh timer 111, a refresh trigger signal 131 is activated and applied to the refresh pulse generating circuit 112, which proceeds to output a refresh pulse φRFSH (136).

Furthermore, the semiconductor storage device of the present embodiment includes a NAND gate 118 to one input of which the output signal 136 of the refresh pulse generating circuit 112 is applied; a NAND gate 119 to one input of which the output signal 135 of the read/write pulse generating circuit 117 is applied; and a NAND gate 120 the inputs to which are the output of the NAND gate 118 and the output of the NAND gate 119. The output terminal of the NAND gate 118 is cross-connected to the other input terminal of the NAND gate 119, and the output terminal of the NAND gate 119 is cross-connected to the other input terminal of the NAND gate 118.

The output signal (one-shot pulse) of the NAND gate 120 is input to the control circuit 104 of the cell array 100 as an RE (row-enable) signal. On the basis of the one-shot pulse of the entered RE signal, the control circuit 104 supplies a pulse signal that decides an interval (an interval during which a selected word line is at a high potential) over which a word driver (not shown) that drives a word line selected by the row decoder 102 is activated.

Further, the signal 135 (one-shot pulse) from the read/write pulse generating circuit 117 is supplied to the control circuit 104 of cell array 100 as a CE (column-enable) signal. The control circuit 104 supplies a pulse that decides the selection interval of a column switch (not shown). The pulse is applied to the gate of the column switch.

If the output signal 136 of the refresh pulse generating circuit 112 undergoes a transition from the low to the high level when the outputs of the NAND gates 118 and 119 are at the high level and the output (RE signal) of the NAND gate 120 is at the low level, the output of the NAND gate 118 assumes the low level and the output signal of the NAND gate 120 changes from the low level to the high level. If the output signal 136 of the refresh pulse generating circuit 112 changes from the high to the low level, then the output of the NAND gate 118 attains the high level and the output signal of the NAND gate 120 changes from the high level to the low level. The same holds true for the output signal 135. In FIG. 1, the symbol "/" represents the fact that the signal name that follows "/" is in the active state at the low level.

When the chip-select signal /CS is at the high level (or there is no read/write access), the standby state results. When the chip-select signal /CS is at the high level, the memory array 101 also attains the standby state.

The address register 106 latches the address signal based upon the internal clock signal K when the chip-select signal /CS is at the low level and the address signal has been finalized [the register responds to transition of an address valid signal /AD (not shown) to the active state].

The output buffer 110 is controlled between the ON state (output-enabled state) and OFF state based upon the control signal 138 that is output from the read/write control circuit 116.

Figure 2:
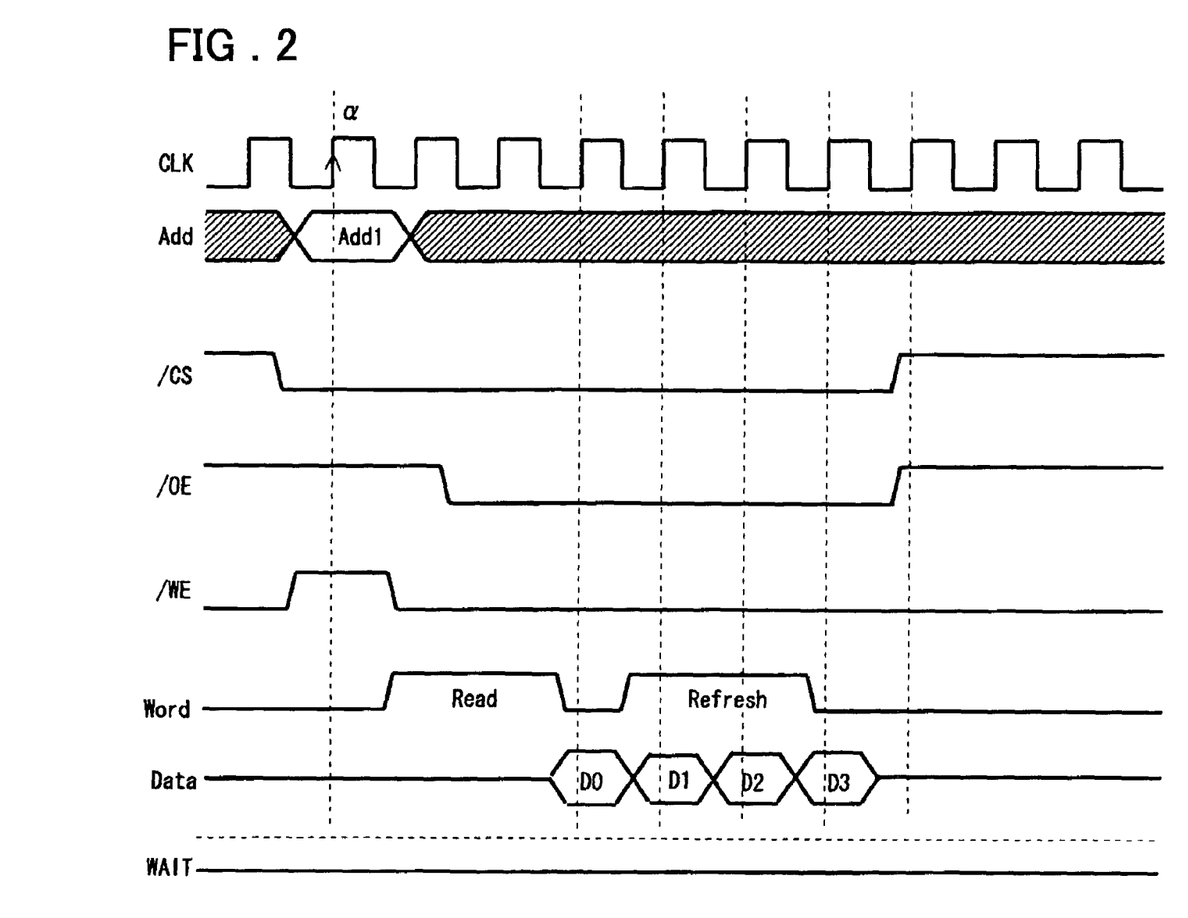
FIG. 2 is a timing diagram for describing the operation of the present embodiment of the present invention.

FIG. 2 is a timing diagram for describing the operation of the present embodiment of the present invention in a case where a refresh request is issued at the time of a burst read operation in the active state. Burst length is assumed to be four. The operation of the present embodiment will be described with reference to FIGS. 1 and 2.

The address signal Add is decided to be an address "Add1", a read operation from the selected memory cell is performed, and read-out data signals D0, D1, D2 and D3 are output from the data terminal DATA in the burst mode. It should be noted that control of low-byte enable and high-byte enable is not directly related to the present invention and is not covered here.

The present embodiment is such that if a refresh request is generated (the refresh trigger signal 131 becomes active) on the occurrence of time-out in the refresh timer 111 at the time of read access, the refresh operation is performed following activation of the cell array core for the read operation (e.g., activation of the precharge circuit, activation of the word line and activation of the sense amplifier circuit).

When there is no read/write request and the output signal 135 of the read/write pulse generating circuit 117 is at the low level, the timing control circuit 115 which receives the output signal 135 places the control signal 132 in the active state (the low level) and supplies it to the refresh pulse generating circuit 112, and the refresh pulse generating circuit 112 outputs an one-shot pulse φRFSH as the output signal 136 based upon the refresh trigger signal 131 from the refresh timer 111. As a result, the output of the NAND gate 118 assumes the low level, the output signal RE of the NAND gate 120 attains the high level and the signal CE assumes the low level (the column switch is not selected in the refresh operation). The refresh operation is carried out as a result.

On the other hand, when there is a read/write request and a read/write pulse φR/W constituting the output signal 135 of the read/write pulse generating circuit 117 is at the high level, the timing control circuit 115 places the control signal 132 in the inactive state (the high level) and the refresh pulse generating circuit 112 does not output the refresh pulse φRFSH immediately even if the refresh trigger signal 131 from the refresh timer 111 is received.

The read/write pulse φR/W that is the output signal 135 of the read/write pulse generating circuit 117 is supplied to the cell array 100 as the chip-enable signal CE. At this time the output signal 136 of the refresh pulse generating circuit 112 assumes the low level. Consequently, the output of the NAND gate 118 attains the high level, the output of the NAND gate 119 assumes the low level upon receiving the high level of the read/write pulse φR/W constituting the output signal 135 of the read/write pulse generating circuit 117, and the output of the NAND gate 120 attains the high level. That is, the signals RE and CE both attain the high level.

When the read/write pulse φR/W that is the output signal 135 of the read/write pulse generating circuit 117 assumes the low level, the timing control circuit 115 places the control signal 132 in the active state (the low level), as a result of which the refresh pulse generating circuit 112 outputs a refresh pulse. That is, the refresh trigger signal 131 in the active state is held by the refresh pulse generating circuit 112 during execution of read access.

As shown also in FIG. 2, refresh in the active state is performed concurrent with the read-out data burst-transfer operation (activation of the memory array 101 for read access has ended at this time). That is, refresh (activation of a word line that has been selected by a refresh address) is performed concurrent with the burst transfer (D0, D1, D2, and D3) from the data I/O control circuit 105 to the data terminal DATA in FIG. 1.

Therefore, in accordance with the present embodiment, refresh is executed in a state hidden from the outside of the semiconductor storage device and read-access delay, etc., does not occur. As a result, a decline in performance is avoided and it is possible to raise access speed. That is, refresh is performed after execution of a write operation even in a case where a refresh request is generated in the active state (at the time of the write operation). In FIG. 2, "Word" indicates the voltage waveform of a selected word line, "Read" represents activation of a selected word line corresponding to a read address, and "Refresh" represents an activation interval (high-potential interval) of a selected word line corresponding to a refresh address.

Further, as shown in FIG. 2, if there is no conflict with refresh when the chip-select signal /CS has transitioned to the active state (see timing α in FIG. 2), the wait signal is placed in the inactive state (the low level in FIG. 2) at all times.

Figure 3:
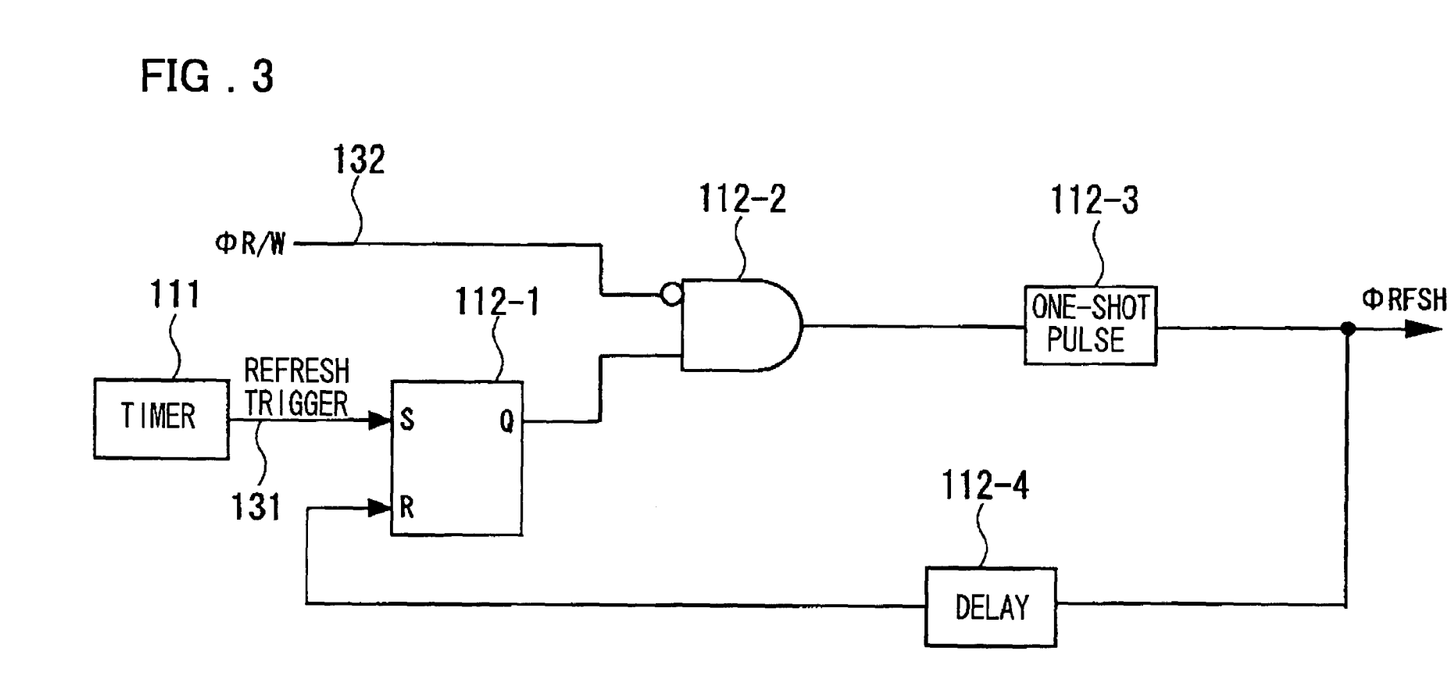
FIG. 3 is a diagram illustrating the circuit arrangement of the present embodiment of the present invention.

FIG. 3 is a diagram illustrating an example of the circuit arrangement of the refresh pulse generating circuit 112 (FIG. 1) that performs the control described above. FIG. 3 illustrates an example of a circuit arrangement for executing the operation of FIG. 2 in the implementation of FIG. 1.

As shown in FIG. 3, the circuit includes an SR flip-flop 112-1 having a set terminal S to which is input the refresh trigger signal 131 output from the refresh timer 111 periodically in accordance with the cell-leak characteristic, etc., the flip-flop being set in response to transition of the refresh trigger signal 131 to the high level; an AND gate 112-2 to which are input an output Q of the SR flip-flop 112-1 and a signal that is the inverse of the control signal 132 from the timing control circuit 115; and a one-shot pulse generating circuit 112-3 for generating the refresh pulse signal φRFSH based upon a rising transition to the high level of the output signal of the AND gate 112-2. The output of the one-shot pulse generating circuit 112-3 is delayed by a delay circuit 112-4 and input to a reset terminal R of the SR flip-flop 112-1.

Described first will be a case where the chip-select signal /CS is at the low level (the active state) and the selected word line is in the inactive state.

On occurrence of time-out in the refresh timer 111, the refresh trigger signal 131 is set to the high level and the output of the SR flip-flop 112-1 is set to the high level. At this time the read/write pulse φR/W is at the low level and so is the signal 132. The AND gate 112-2 therefore changes from the low level to the high level and the one-shot pulse φRFSH is generated. The one-shot pulse φRFSH is supplied to the refresh address generating circuit 113 and also as the selection control signal of the multiplexer 114. In response to the rising edge of the one-shot pulse φRFSH, the refresh address generating circuit 113 outputs a value obtained by incrementing the current count value by one and the multiplexer 114 selects the output (refresh address) of the refresh address generating circuit 113 and supplies it to the row decoder 102. The latter decodes the refresh address, a word driver (not shown) that drives the word line selected as a result of decoding is activated based upon the control signal (one-shot pulse) RE, and the selected word line corresponding to the refresh address is activated. In response to the high level of the one-shot pulse φRFSH, the SR flip-flop 112-1 is reset and the output Q thereof is reset to the low level.

Next, a case where a refresh request has been issued when the chip-select signal /CS is at the low level will be described. The refresh trigger signal 131 is active (at the high level), the output of the SR flip-flop 112-1 is at the high level and so is the read/write pulse φR/W (the control signal 132). As a result, the output of the AND gate 112-2 assumes the low level, the output of the one-shot pulse generating circuit 112-3 remains at the low level and the output of the SR flip-flop 112-1 is held at the high level. At this time the refresh timer 111, which outputs the trigger signal periodically, may reset the refresh trigger signal 131 to the inactive state.

When read/write access of the cell array 100 ends (e.g., when the read-out data is read out to the data I/O control circuit 105) and the read/write pulse φR/W falls from the high level to the low level, the output of the AND gate 112-2 attains the high level and the one-shot pulse φRFSH is output. In response, the refresh address generating circuit 113 in FIG. 1 outputs a value obtained by incrementing the present count value by one, and the multiplexer 114 selects the output (refresh address) of the refresh address generating circuit 113 and supplies it to the row decoder 102. The latter decodes the refresh address, a word driver (not shown) that drives the word line selected as a result of decoding is activated based upon the control signal (one-shot pulse) RE, and the selected word line corresponding to the refresh address is activated.

In response to the one-shot pulse φRFSH, the SR flip-flop 112-1 is reset and the one-shot pulse φRFSH is made inactive. It should be noted that in order to assure the necessary pulse width of the output signal of one-shot pulse generating circuit 112-3, the signal is supplied to the reset terminal of the SR flip-flop 112-1 upon being delayed for a prescribed period of time by the delay circuit 112-4 taking timing leeway, etc., into consideration. The delay circuit 112-4 may be deleted if the pulse width of the one-shot pulse has some timing leeway.

Thus, in accordance with the present embodiment, adjustment along the time axis is carried out in such a manner that refresh at the time of the active state will be performed after read/write of the cell array 100 ends. It should be noted that in order to simplify the description, the circuit shown in FIG. 3 has been described with regard to an example in which refresh is controlled based upon the value of the read/write pulse φR/W that controls the activation of the word line corresponding to read/write access. However, other control signals and control circuits may of course be employed as an arrangement for giving priority to read/write access by storing a refresh request generated at the time of the active state.

Further, in case of application to an asynchronous memory in the circuit of FIG. 3, it may be so arranged that refresh is performed when data is read out in the order of the addresses in a page after a plurality of items of word data in one page have been read out of the cell array in the page mode.

Figure 4A:
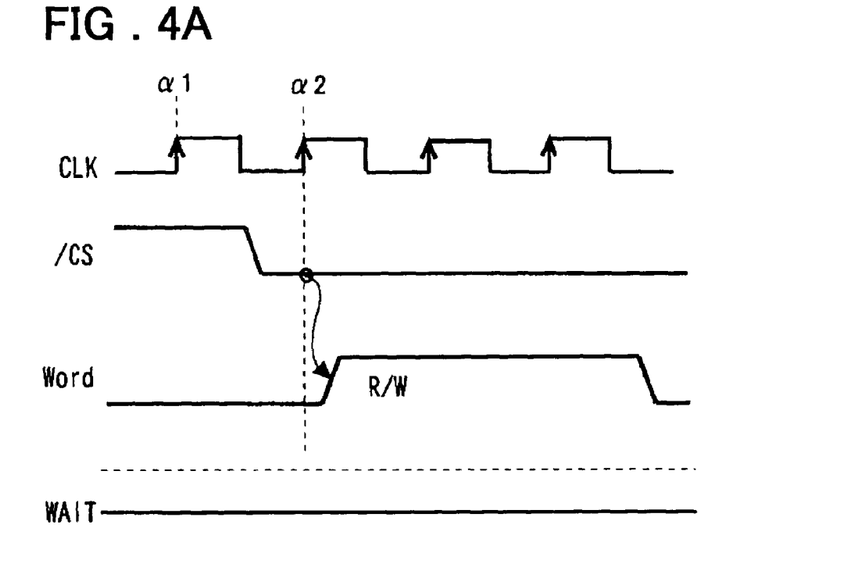
FIGS. 4A and 4B are timing diagrams for describing the operation of another embodiment of the present invention.
Figure 4B:
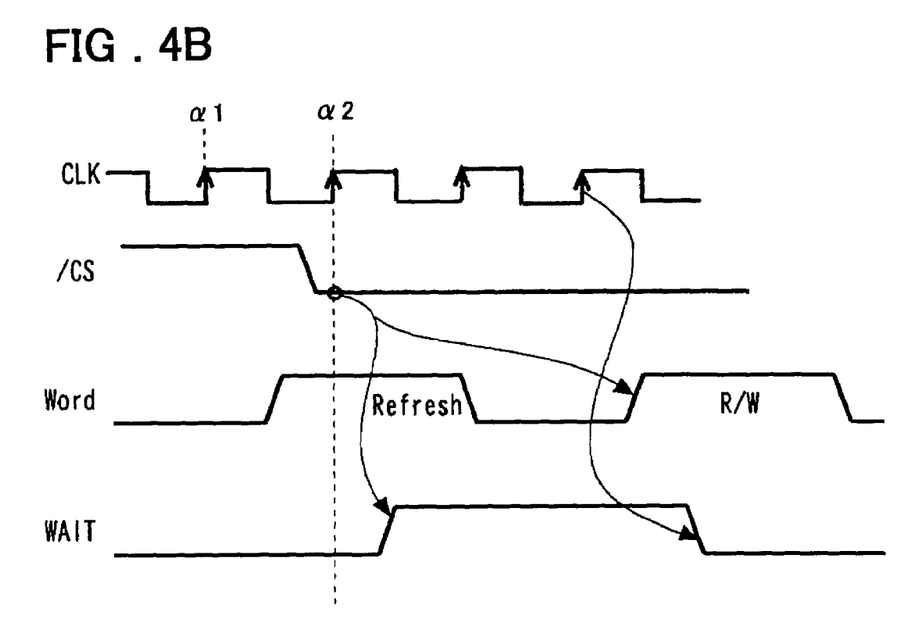

Another embodiment of the present invention will be described next. FIGS. 4A and 4B are diagrams for describing the operation of another embodiment of the present invention. If there is read/write access in a case where refresh is not in progress when the semiconductor storage device undergoes a transition from the standby state to the active state, read/write access is executed immediately, as illustrated in FIG. 4A. That is, according to the present embodiment, when the chip-select signal /CS is detected at the rising edge of the clock signal CLK and the chip-select signal /CS transitions from the high level to the low level in an interval defined by the timings α1 and α2 of the rising edges of the clock signal CLK, the read/write operation is executed immediately if the interval is not one in which the word line that has been selected by the refresh address is active.

In the present embodiment, control as described with reference to FIGS. 6A and 6B is not carried out, namely control whereby the read/write operation is performed upon elapse of a prescribed time delay following the transition of the chip-select signal /CS from the high to the low level. As a result, access can be speeded up.

On the other hand, as illustrated in FIG. 4B, the present embodiment is such that if a word line selected by a refresh address has been activated when the chip-select signal /CS undergoes a transition from the high to the low level, read/write access is made to stand by i.e., to wait) until the refresh operation ends, and the wait signal is activated and output over a prescribed period of time.

Even if there is the possibility of a conflict with internal refresh when the chip-select signal /CS undergoes a transition from the high level to the low level, as indicated in FIG. 4A, the probability thereof is very low. When the semiconductor storage device undergoes a transition to the active state, the probability that the wait signal will be output and the a delay produced in read/write access is very low. In accordance with the present embodiment, therefore, a decline in the performance of the kind seen in the conventional semiconductor storage device of FIGS. 6A and 6B is avoided.

In a case where standby control of read/write access to the semiconductor storage device by the wait signal is performed in the CPU or controller to which the wait signal from the semiconductor storage device is input, the wait signal that is output from the semiconductor storage device need only be monitored when the chip-select signal /CS falls. The load, therefore, is alleviated. Development of software is also facilitated.

Figure 5:
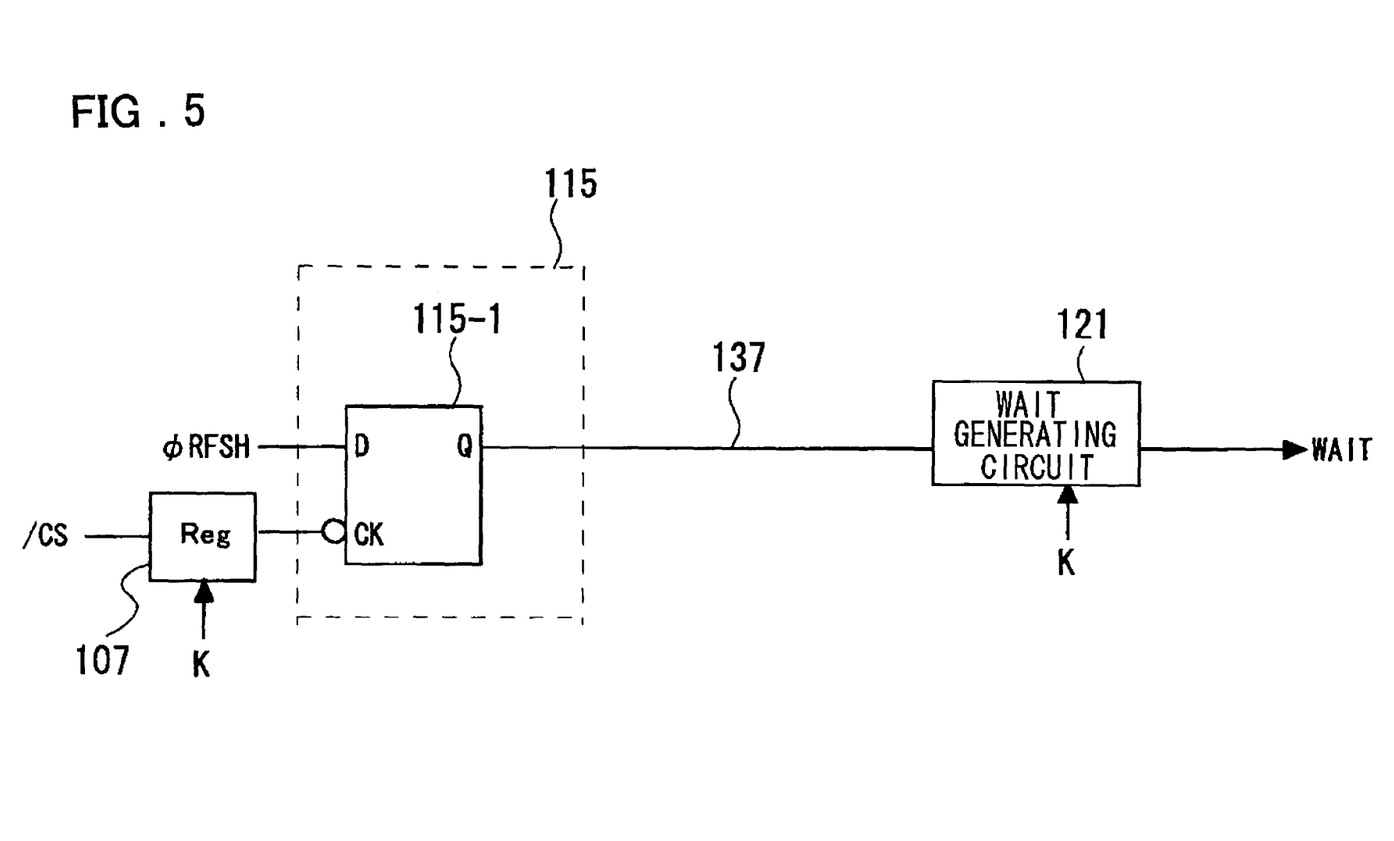
FIG. 5 is a diagram illustrating the circuit arrangement of this other embodiment of the present invention.

FIG. 5 is a diagram illustrating the structure of the timing control circuit 115 (see FIG. 1) that performs the control shown in FIG. 4. As shown in FIG. 5, the timing control circuit 115 has a D-register 115-1 for sampling and outputting the refresh pulse φRFSH at the falling edge of the chip-select signal /CS (the output signal of register 107 in FIG. 1). The wait generating circuit 121 to which the control signal 137 of the D-register circuit 115-1 is input outputs the wait signal of the prescribed pulse width when the output signal 137 of the D-register circuit 115-1 is at the high level.

In the example illustrated in FIG. 4B, the wait generating circuit 121 is so adapted that the wait signal, which is set to the high level at the rising edge of the clock signal, is maintained at the high level for two clock cycles from the aforesaid rising edge and falls to the low level at the rising edge of the next clock. In the present invention, however, the high-level interval of the wait signal is not limited to two cycles as a matter of course.

In the present embodiment, a controller (not shown) performs control to make read/write access stand by when the wait signal that is output from the semiconductor storage device is activated (asserted).

Figure 7:
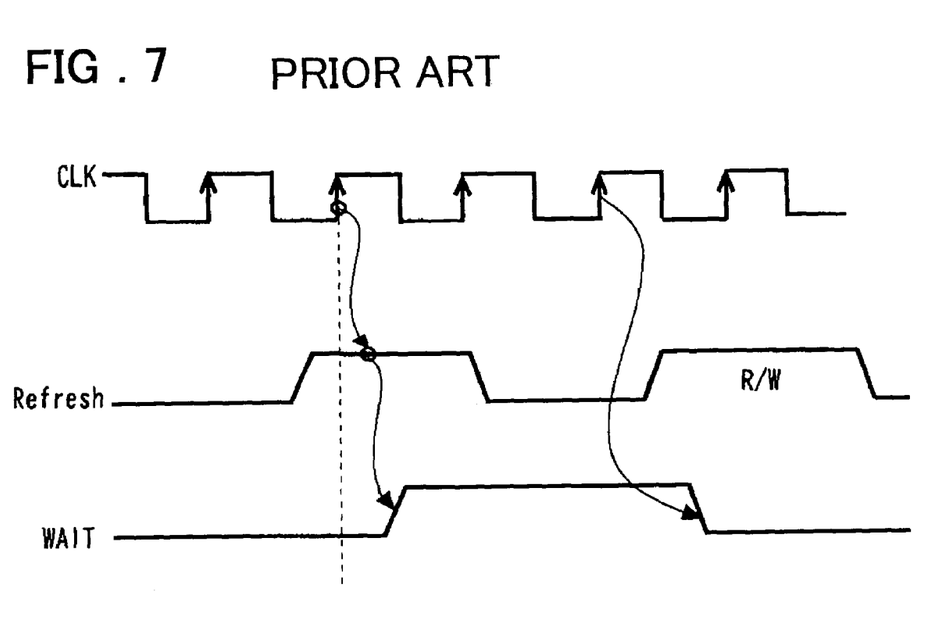
FIG. 7 is a timing diagram illustrating one example of output of a wait signal from the conventional semiconductor storage device.

Unlike the present embodiment, the conventional semiconductor storage device described in Patent Reference 2 is such that the wait signal is output over a prescribed interval (e.g., two clock cycles) in the refresh interval (i.e., when Refresh is at the high level) irrespective of the chip-select signal CS (which corresponds to signal CE# in FIG. 8), as illustrated in FIG. 7 by way of example.

Owing to higher integration density and higher packaging density of recent semiconductor devices, there are many cases where a memory device is placed very close to the CPU, etc., in a system-on-chip (SOC) device, chip-size package (CSP) and multichip module (MCM), etc. When the memory device is in the standby state, the ambient temperature (operating temperature) of the device rises owing to operation of the nearby CPU, and this is accompanied by shortening of the refresh interval of the DRAM memory array. In accordance with the present embodiment, the CPU or controller in such an arrangement need monitor the wait signal only when the chip-select signal /CS is set to the low level, and refresh control can be performed while the load on the CPU is alleviated.

In the above embodiments, a clock-synchronized, common-I/O semiconductor storage device has been described. However, it goes without saying that the invention is applicable to a separated-I/O semiconductor storage device such as a QDR. Further, the invention can be used similarly in an asynchronous mobile-specified SRAM having a page mode.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device comprising:
a memory cell array having a plurality of memory cells requiring a refresh operation in order for data to be retained; and
a circuit, receiving a control signal that controls a standby state and active state of the semiconductor storage device, for executing read or write access to the memory cell array immediately if a refresh operation is not being performed when the control signal undergoes a transition from a standby state to a value indicative of an active state, and activating and outputting a wait signal which is for causing read or write access to stand by, if a refresh operation is in progress when the control signal undergoes a transition from the standby state to the active state.

2. The semiconductor storage device according to claim 1, further comprising a circuit, receiving the control signal and a refresh signal that controls execution of the refresh operation, for exercising control in such a manner that the wait signal is set to the active state and output if the refresh signal is indicating the refresh operation in a cycle in which the control signal undergoes a transition from the standby state to a value that specifies the active state, and the setting of the wait signal from an inactive state to the active state is disabled in intervals other than this cycle.

3. The semiconductor storage device according to claim 2, wherein the wait signal is activated and output for a predetermined prescribed number of cycles.

4. The semiconductor storage device according to claim 1, comprising:
a control circuit, receiving at least the control signal (referred to as a "chip-select signal") that controls a standby state and active state of said semiconductor storage device; and
a wait generating circuit, receiving an output signal of said control circuit, for generating and outputting a wait signal based upon said output signal;
wherein said control circuit exercises control so as to enable the wait signal, which indicates that a refresh operation is in progress, to be set to the active state and output in a cycle in which the chip-select signal undergoes a transition from the standby state of said semiconductor storage device to a value that specifies the active state, and disable the setting of the wait signal to the active state and the outputting thereof in intervals other than said cycle.

5. The semiconductor storage device according to claim 1, wherein said device has interface specifications compatible with a static-type random-access memory.

6. An electronic apparatus having a semiconductor storage device as set forth in claim 1 and at least one of a CPU and memory controller, wherein when at least one of said CPU and memory controller have activated a control signal, which controls a standby state and active state of said semiconductor storage device, and have placed said semiconductor storage device in the active state, it is determined whether a wait signal from said semiconductor storage device has been asserted, and read/write access to said semiconductor storage device is made to stand by if the wait signal has been asserted.

7. A semiconductor storage device comprising:
a memory cell array having a plurality of bit lines, a plurality of word lines and a plurality of memory cells, which require a refresh operation in order for data to be retained, at intersections of the plurality of bit lines and plurality of word lines; and
a circuit, receiving a control signal controlling a standby state and active state of the semiconductor storage device, for exercising control in such a manner that a wait signal for causing read or write access to stand by is set to an active state and is output over a prescribed interval if the refresh operation is in progress when the control signal undergoes a transition from a standby state to an active state; and
in such a manner that setting of the wait signal to the active state is disabled and read or write access is executed without being made to wait except in a case where the refresh operation is in progress when the control signal undergoes a transition from the standby state to the active state.

8. The semiconductor storage device according to claim 7, further comprising a circuit for exercising control in such a manner that a word line corresponding to a refresh address is selected and refresh is performed after said memory cell array is activated for read or write access when a refresh request is generated at the time of read or write access.

9. The semiconductor storage device according to claim 7, wherein a word line that has been selected by an access address is activated at the time of read access, and in an interval in which a plurality of data signals, which have been read out of said memory cell array, are output from a data terminal successively, a word line corresponding to a refresh address is activated and refresh performed.

10. The semiconductor storage device according to claim 7, further comprising:
   a circuit for generating a refresh address and performing a refresh operation based upon a refresh trigger signal for starting up refresh; and
   a circuit for exercising control in such a manner that when the refresh trigger signal is activated concurrent with a read operation, a word line of the refresh address is activated and refresh performed in parallel with an operation for activating a word line of a read access address and reading out, in a burst from a data terminal, a plurality of data signals, each being read out via a sense amplifier.

11. A semiconductor storage device comprising:
   a memory cell array having a plurality of bit lines, a plurality of word lines and a plurality of memory cells, which require a refresh operation in order for data to be retained, at intersections of the plurality of bit lines and plurality of word lines;
   a refresh pulse generating circuit for generating a refresh pulse signal that controls execution of the refresh operation;
   a terminal for receiving a control signal (referred to as a "chip-select signal") that controls a standby state and active state of the semiconductor storage device;
   a wait terminal for outputting a wait signal;
   a control circuit, receiving the chip-select signal and the refresh pulse signal, for sampling and outputting the refresh pulse signal in response to a transition of the chip-select signal from the standby state of the semiconductor storage device to a value that specifies the active state thereof, when said transition occurs; and
   a wait generating circuit, receiving an output signal from said control circuit, for activating the wait signal based upon the output signal and outputting the wait signal to said wait terminal.

12. The semiconductor storage device according to claim 11, wherein when the output signal from said control circuit is in the active state, said wait generating circuit activates the wait signal based upon a rising edge or falling edge of a synchronizing signal input thereto, holds the active state of the wait signal for a predetermined prescribed cycle interval of the clock signal, and then deactivates the wait signal.

13. The semiconductor storage device according to claim 11, further comprising a read/write pulse generating circuit for executing the read or write access without being made to wait unless the refresh operation is in progress when the control signal undergoes a transition from the standby state to the active state.

14. The semiconductor storage device of claim 11, wherein the wait signal is only generated if the chip-select signal changes state from the standby state to the active state during the refresh operation.

* * * * *